US009759961B2

(12) United States Patent
Li et al.

(10) Patent No.: US 9,759,961 B2
(45) Date of Patent: Sep. 12, 2017

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Pan Li, Beijing (CN); Wenbo Li, Beijing (CN); Yong Qiao, Beijing (CN); Hongfei Cheng, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/905,738

(22) PCT Filed: Apr. 20, 2015

(86) PCT No.: PCT/CN2015/076963
§ 371 (c)(1),
(2) Date: Jan. 15, 2016

(87) PCT Pub. No.: WO2016/110022
PCT Pub. Date: Jul. 14, 2016

(65) Prior Publication Data
US 2016/0327838 A1 Nov. 10, 2016

(30) Foreign Application Priority Data
Jan. 8, 2015 (CN) .................... 2015 2 0012864 U

(51) Int. Cl.
*H01L 29/04* (2006.01)
*G02F 1/1343* (2006.01)
(Continued)

(52) U.S. Cl.
CPC ...... *G02F 1/134336* (2013.01); *G02F 1/1362* (2013.01); *G02F 1/13439* (2013.01);
(Continued)

(58) Field of Classification Search
CPC ............................ H01L 27/1214; H01L 27/12
(Continued)

(56) References Cited

U.S. PATENT DOCUMENTS

| | | | | |
|---|---|---|---|---|
| 8,810,764 B2* | 8/2014 | Nishida | ............. | G02F 1/134363 349/139 |
| 9,285,644 B2* | 3/2016 | Hagiwara | ......... | G02F 1/133707 |
| 9,293,481 B2* | 3/2016 | Wu | .................... | G02F 1/134309 |
| 2004/0233360 A1* | 11/2004 | Yoshida | ............. | G02F 1/133555 349/114 |
| 2009/0103035 A1* | 4/2009 | Suzuki | ............. | G02F 1/134363 349/141 |
| 2010/0128208 A1* | 5/2010 | Kurasawa | ............. | G02F 1/1323 349/106 |
| 2010/0231845 A1 | 9/2010 | Seong et al. | | |
| 2011/0149220 A1* | 6/2011 | Byun | ................. | C08G 73/1042 349/123 |
| 2012/0127067 A1* | 5/2012 | Tseng | ................ | G02F 1/134336 345/87 |
| 2013/0107184 A1* | 5/2013 | Maeda | ............. | G02F 1/134363 349/141 |
| 2013/0113693 A1* | 5/2013 | Araki | ................ | G02F 1/134363 345/87 |

(Continued)

FOREIGN PATENT DOCUMENTS

CN 101303500 11/2008
CN 102176092 9/2011
(Continued)

OTHER PUBLICATIONS

International Search Report and Written Opinion with English Language Translation, dated Sep. 30, 2015, Application No. PCT/CN2015/076963.

*Primary Examiner* — Jami M Valentine
(74) *Attorney, Agent, or Firm* — Blakely Sokoloff Taylor & Zafman LLP

(57) ABSTRACT

The present invention discloses an array substrate, a display panel, and a display device, for solving a problem of tip discharge a comb pixel electrode comprised in a sub-pixel unit in the prior art, which produces discharge to surrounding data lines, gate lines, and neighboring pixel electrodes, so that neighboring sub-pixel units are subject to interference and display effect is influenced. The array substrate comprises a base plate, the base plate is further provided with a plurality of sub-pixel units, each of the sub-pixel units comprises a pixel electrode of a comb structure, and the base plate is further provided with a shielding electrode which is electrically connected with the pixel electrode.

12 Claims, 6 Drawing Sheets

(51) Int. Cl.
  *G02F 1/1362*  (2006.01)
  *H01L 23/60*  (2006.01)
  *H01L 27/12*  (2006.01)
  *H01L 29/423*  (2006.01)
  *G02F 1/1337*  (2006.01)

(52) U.S. Cl.
  CPC .. *G02F 1/133707* (2013.01); *G02F 1/136286* (2013.01); *H01L 23/60* (2013.01); *H01L 27/124* (2013.01); *H01L 29/42384* (2013.01); *G02F 2001/134345* (2013.01); *G02F 2001/136218* (2013.01); *G02F 2201/123* (2013.01); *G02F 2201/124* (2013.01); *H01L 2924/0002* (2013.01)

(58) Field of Classification Search
  USPC .......................................... 257/72; 438/149
  See application file for complete search history.

(56) References Cited

U.S. PATENT DOCUMENTS

2015/0185564 A1* 7/2015 Konno .............. G02F 1/134309
                                                                  349/43

FOREIGN PATENT DOCUMENTS

| CN | 103792738 | 5/2014 |
| KR | 20080028565 | 4/2008 |

* cited by examiner

ARRAY SUBSTRATE, DISPLAY PANEL AND DISPLAY DEVICE

FIELD OF THE INVENTION

The present invention relates to the field of liquid crystal display technology, and particularly to an array substrate, a display panel, and a display device.

BACKGROUND OF THE INVENTION

Due to features of a small thickness, low power consumption, being nonradiative, and so on, a thin film transistor liquid crystal display (TFT-LCD) recently has developed rapidly and taken the dominant place in the current flat panel display market. Nowadays, the TFT-LCD have been widely applied in various products of large, medium or small size, and almost covered most electronic products in the current information society. The TFT-LCD has been applied to a product of a relatively large size like liquid crystal TV and high definition TV.

In the prior art, sub-pixel units of a pixel electrode should be designed to have a comb structure or at least have a comb structure at an edge, so that multi-domain display can be realized. However, the pixel electrode of the comb structure may bring about tip discharge to neighboring sub-pixel electrodes, gate lines, and data lines, resulting in significant interference to neighboring sub-pixel units, which influences display effect of the display panel.

SUMMARY OF THE INVENTION

It is an object of the present invention to provide an array substrate, a display panel, and a display device, so that one or more problems as mentioned above can be avoided or at least alleviated. According to the present invention, the problem in the prior art in which tip discharge of a comb electrode comprised in a sub-pixel unit results in interference on surrounding data lines, gate lines, and neighboring sub-pixel units, can be solved.

The object of the present invention is realized by the following technical solutions.

An embodiment of the present invention provides an array substrate, comprising a base plate. The base plate is further provided with a plurality of sub-pixel units, each of the sub-pixel units comprises a pixel electrode of a comb structure, and the base plate is further provided with a shielding electrode which is electrically connected with the pixel electrode. In the present embodiment, since the pixel electrode is electrically connected with the shielding electrode, tip discharge of the pixel electrode having a comb structure can be effectively eliminated or suppressed, so that interference on surrounding data lines, gate lines, and neighboring sub-pixel units due to tip discharge of the pixel electrode is eliminated.

Preferably, the pixel electrode has a comb structure at an edge or has a comb structure as a whole. In the present embodiment, since the pixel electrode is electrically connected with the shielding electrode, tip discharge of the pixel electrode can be effectively eliminated or suppressed, no matter the pixel electrode has a comb structure at an edge or has a comb structure as a whole.

Preferably, the shielding electrode is electrically connected with a tip of the comb structure of the pixel electrode. In the present embodiment, since the tip of the comb structure of the pixel electrode is electrically connected with the shielding electrode, tip discharge of the comb structure of the pixel electrode can be better eliminated, and the fabricating process for the pixel electrode can be realized more easily.

Preferably, every two rows of sub-pixel units form a sub-pixel unit group, two gate lines are arranged between two rows of sub-pixel units of each of the sub-pixel unit groups; and the shielding electrode is at least arranged at an upper edge of the pixel electrode in an upper row of sub-pixel units of the sub-pixel unit group, and the shielding electrode is at least arranged at a lower edge of the pixel electrode in a lower row of sub-pixel units of the sub-pixel unit group. In the present embodiment, as for a dual-gate driving sub-pixel unit array, since a distance between the pixel electrodes in neighboring sub-pixel unit groups is relatively small, the shielding electrode is at least arranged at upper and lower edge of the sub-pixel unit groups, so that interference between neighboring sub-pixel unit groups is shield.

Preferably, the pixel electrode comprises a first pixel electrode and a second pixel electrode which are arranged from top to bottom in a column direction, and a gate line is arranged between the first pixel electrode and the second pixel electrode of sub-pixel units belonging to a same column, and the shielding electrode is arranged at an upper edge of the first pixel electrode, the shielding electrode is arranged at a lower edge of the second pixel electrode. In the present embodiment, as for a single-gate driving sub-pixel unit array, interference between two neighboring rows of sub-pixel units in the column direction is shield.

Preferably, the pixel electrode comprises a first pixel electrode and a second pixel electrode which are arranged from top to bottom in a column direction, and a gate line is arranged between the first pixel electrode and the second pixel electrode of sub-pixel units belonging to a same column, and the shielding electrode is arranged at at least one edge of the first pixel electrode, and the shielding electrode is arranged at at least one edge of the second pixel electrode. In the present embodiment, interference between two neighboring rows of sub-pixel units in both the column direction and the row direction is shield.

Preferably, the pixel electrode comprises a first pixel electrode and a second pixel electrode which are arranged from top to bottom in a column direction, and a gate line is arranged between the first pixel electrode and the second pixel electrode of sub-pixel units belonging to a same column, and the shielding electrode is arranged at all edges of the first pixel electrode and the second pixel electrode. In the present embodiment, interference between sub-pixel units and between the first pixel electrode and the second pixel electrode is shield.

Preferably, the shielding electrode, the first pixel electrode and the second pixel electrode are arranged in the same layer. In the present embodiment, the process can be saved by arranging the shielding electrode, the first pixel electrode and the second pixel electrode in the same layer.

Preferably, the shielding electrode is made from ITO or IZO.

Embodiments of the present invention have the following beneficial effects. The shielding electrode is arranged at at least one edge of the pixel electrode, so that interference on surrounding data lines, gate lines, and neighboring sub-pixel units due to tip discharge of the pixel electrode is eliminated, and display effect of the display panel is improved.

An embodiment of the present invention provides a display panel comprising the array substrate provided in the above embodiments.

Embodiments of the present invention have the following beneficial effects. The shielding electrode is arranged at at least one edge of the pixel electrode, so that interference on surrounding data lines, gate lines, and neighboring sub-pixel units due to tip discharge of the pixel electrode is eliminated, and display effect of the display panel is improved.

An embodiment of the present invention provides a display device comprising the array substrate provided in the above embodiments.

Embodiments of the present invention have the following beneficial effects. The shielding electrode is arranged at at least one edge of the pixel electrode, so that interference on surrounding data lines, gate lines, and neighboring sub-pixel units due to tip discharge of the pixel electrode is eliminated, and display effect of the display panel is improved.

DETAILED DESCRIPTION OF THE INVENTION

Figure 1:
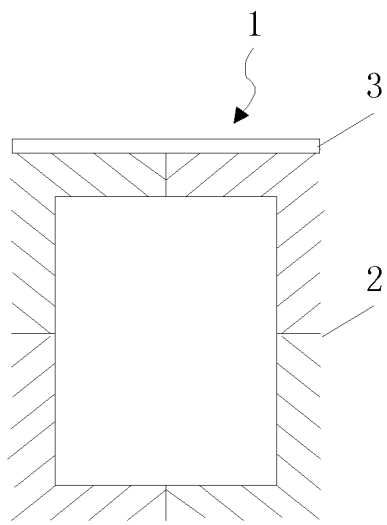
FIG. 1 is a structural view for sub-pixel units of the present invention.

The present invention will be elucidated hereinafter in details with reference to the accompanying drawings and embodiments. It is noted that the same reference numerals are used throughout the figures to indicate the same or similar parts. These embodiments are exemplary in nature for illustrating the present invention, and do not intend to limit the present invention.

In an embodiment of the present invention, there is provided an array substrate comprising a base plate on which an array of sub-pixel units is formed. FIG. 1 is a structural view for a sub-pixel unit 1. The sub-pixel unit 1 comprises a pixel electrode 2 and a shielding electrode 3. The pixel electrode 2 has a comb structure at least at an edge, and is provided with the shielding electrode 3 at at least one edge. The shielding electrode 3 is electrically connected with a tip of the comb structure of the pixel electrode 2. In figures, a rectangular frame surrounded by oblique lines indicates the pixel electrode 2, where the rectangular frame indicates a body of the pixel electrode, and oblique lines indicates edge portions of the pixel electrode. It is noted that the pixel electrode 2 not only can only have the comb structure at the edge, but also can have the comb structure as a whole, and that the shielding electrode 3 can not only be arranged at one edge of the pixel electrode 2, but also at two or more edges of the pixel electrode 2. In an embodiment of the present invention, the shielding electrode 3 is arranged at at least one edge of the pixel electrode 2, so that the interference of tip discharge of the pixel electrode 2 on the surrounding data lines, gate lines, and neighboring sub-pixel units 1 is eliminated.

Figure 2:
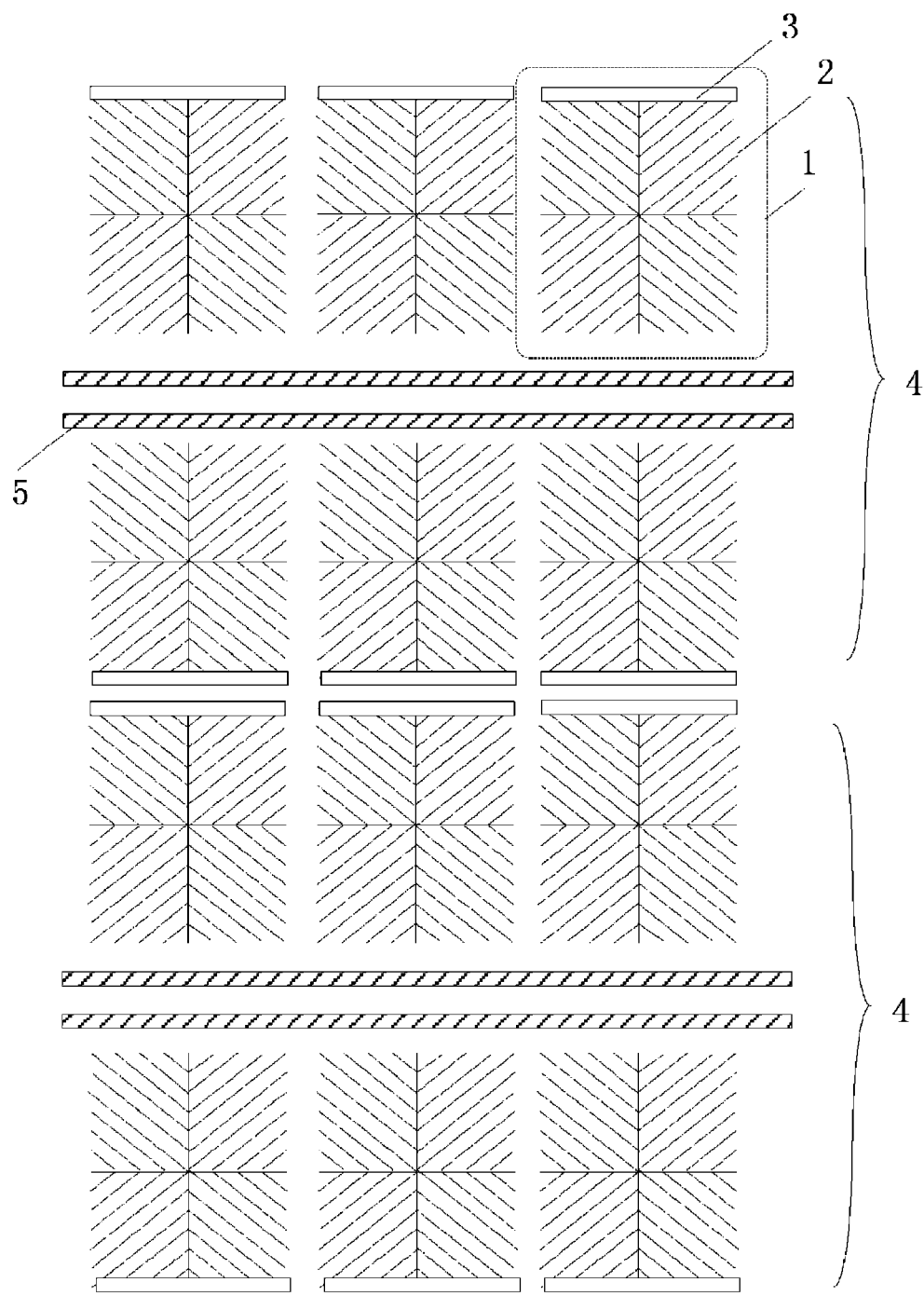
FIG. 2 is a structural view for an array substrate in a preferred embodiment of the present invention.

Reference is made to FIG. 2, which is a schematic view for an array substrate in a preferred embodiment. Every two rows of sub-pixel units 1 form a sub-pixel unit group 4. Two gate lines 5 are arranged between two rows of sub-pixel units 1 of each sub-pixel unit group 4. The shielding electrode 3 is at least arranged at an upper edge of the pixel electrode 2 in an upper row of sub-pixel units 1 of the sub-pixel unit group 4, and the shielding electrode 3 is at least arranged at a lower edge of the pixel electrode 2 in a lower row of sub-pixel units 1 of the sub-pixel unit group 4. In the present embodiment, as for a dual-gate driving sub-pixel unit array, since a distance between the pixel electrodes 2 in neighboring sub-pixel unit groups 4 is relatively small, the shielding electrode 3 is at least arranged at upper and lower edge of the sub-pixel unit groups 4, so that interference between neighboring sub-pixel unit groups 4 is shield.

Figure 3:
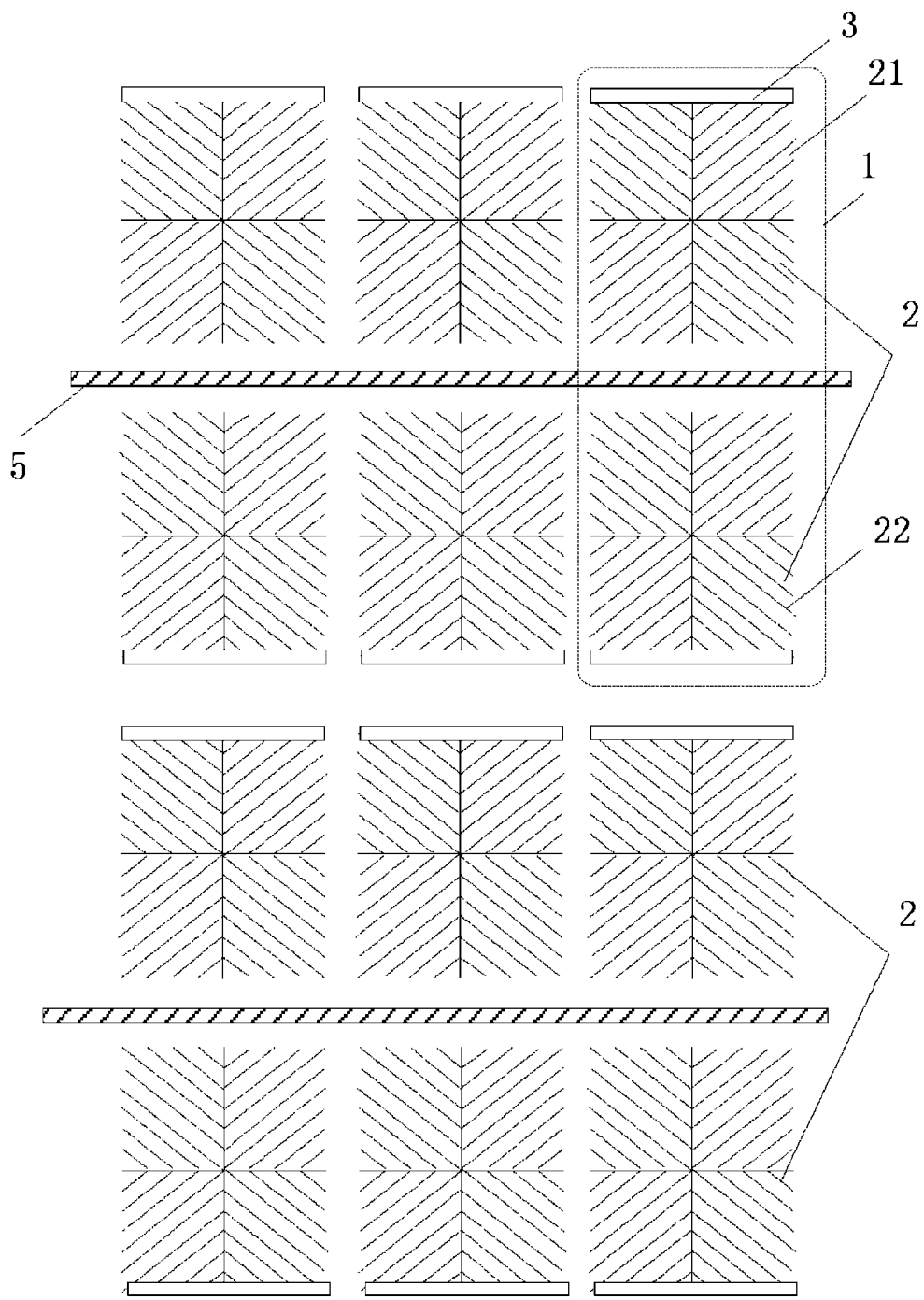
FIG. 3 is a structural view for another array substrate in a preferred embodiment of the present invention.

Reference is made to FIG. 3, which is a schematic view for another array substrate in a preferred embodiment. The pixel electrode 2 comprises a first pixel electrode 21 and a second pixel electrode 22 which are arranged from top to bottom in a column direction and have a comb structure. A gate line 5 is arranged between the first pixel electrode 21 and the second pixel electrode 22 of sub-pixel units 1 belonging to the same column. The shielding electrode 3 is at least arranged at the upper edge of the first pixel electrode 21, and the shielding electrode 3 is at least arranged at the lower edge of the second pixel electrode 22. In the present embodiment, the shielding electrode 3 is at least arranged at the upper and lower edge of the pixel electrode 2 (e.g., the upper edge of the first pixel electrode 21 and the lower edge of the second pixel electrode 22), so that interference between two neighboring rows of sub-pixel units is shield. For example, the shielding electrode is arranged at an upper edge of the first pixel electrode 21, and the shielding electrode is arranged at a lower edge of the second pixel electrode 22. In the present embodiment, interference between two neighboring rows of sub-pixel units in the column direction is shield. Besides, for example, the shielding electrode is arranged at the upper edge and at least one lateral edge of the first pixel electrode 21, and the shielding electrode is arranged at the lower edge and at least one lateral edge of the second pixel electrode 22. In the present embodiment, interference between two neighboring rows of sub-pixel units in both the column direction and the row direction is shield. Again, for example, the shielding electrode is arranged at all edges of the first pixel electrode 21 and the second pixel electrode 22. In the present embodiment, interference between sub-pixel units and between the first pixel electrode 21 and the second pixel electrode 22 is shield.

Figure 4:
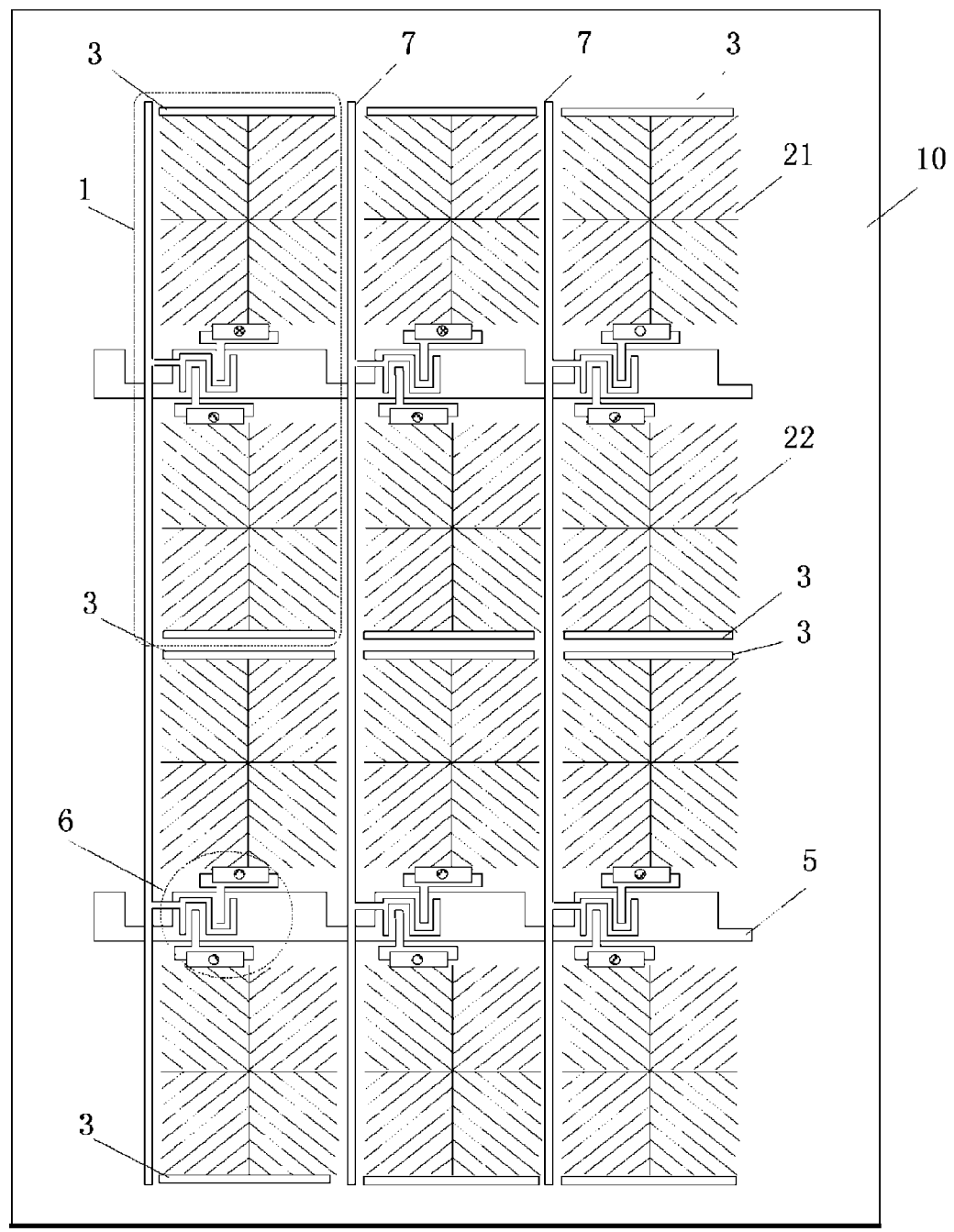
FIG. 4 is a structural view for a first specific array substrate on basis of FIG. 3.
Figure 5:
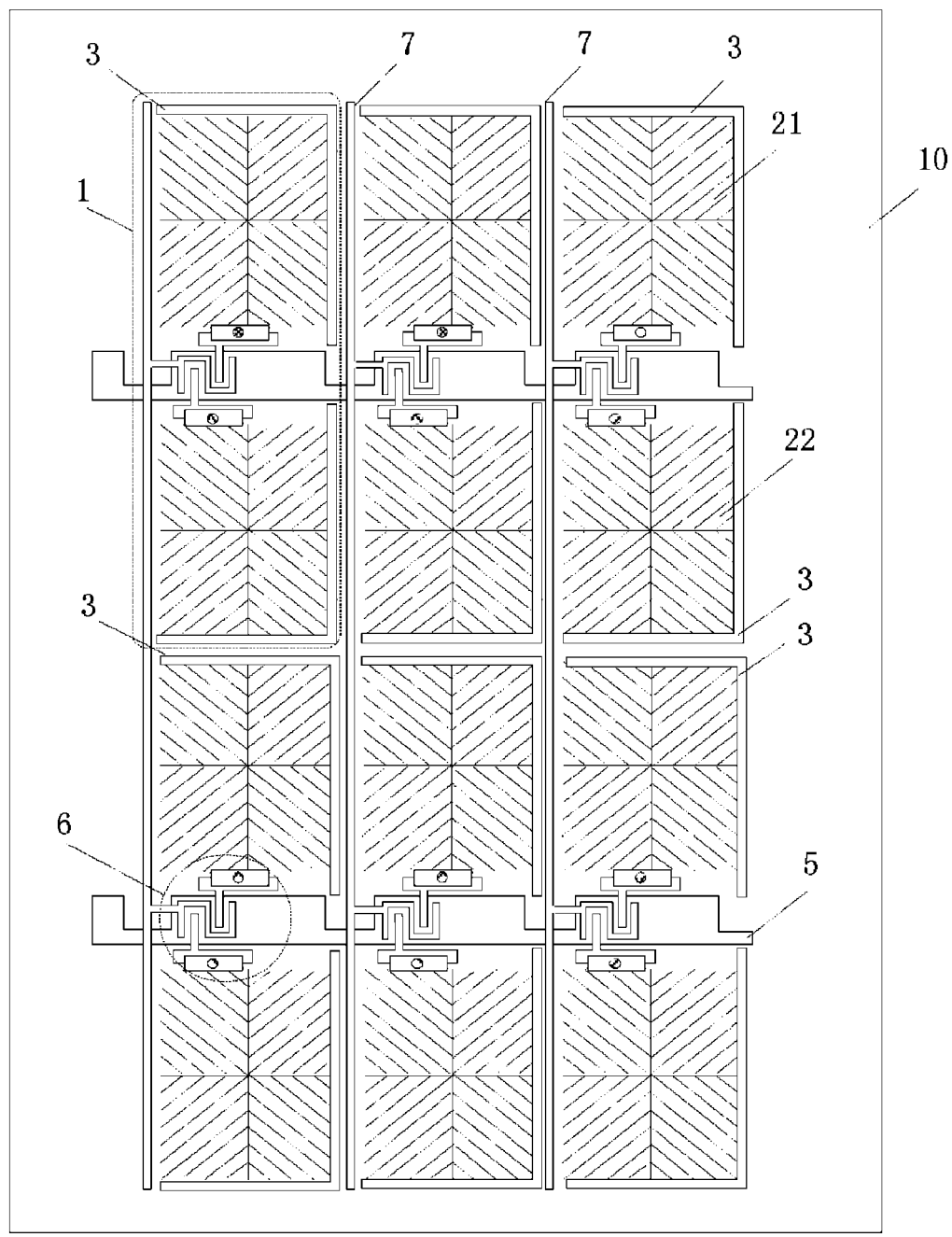
FIG. 5 is a structural view for a second specific array substrate on basis of FIG. 3.
Figure 6:
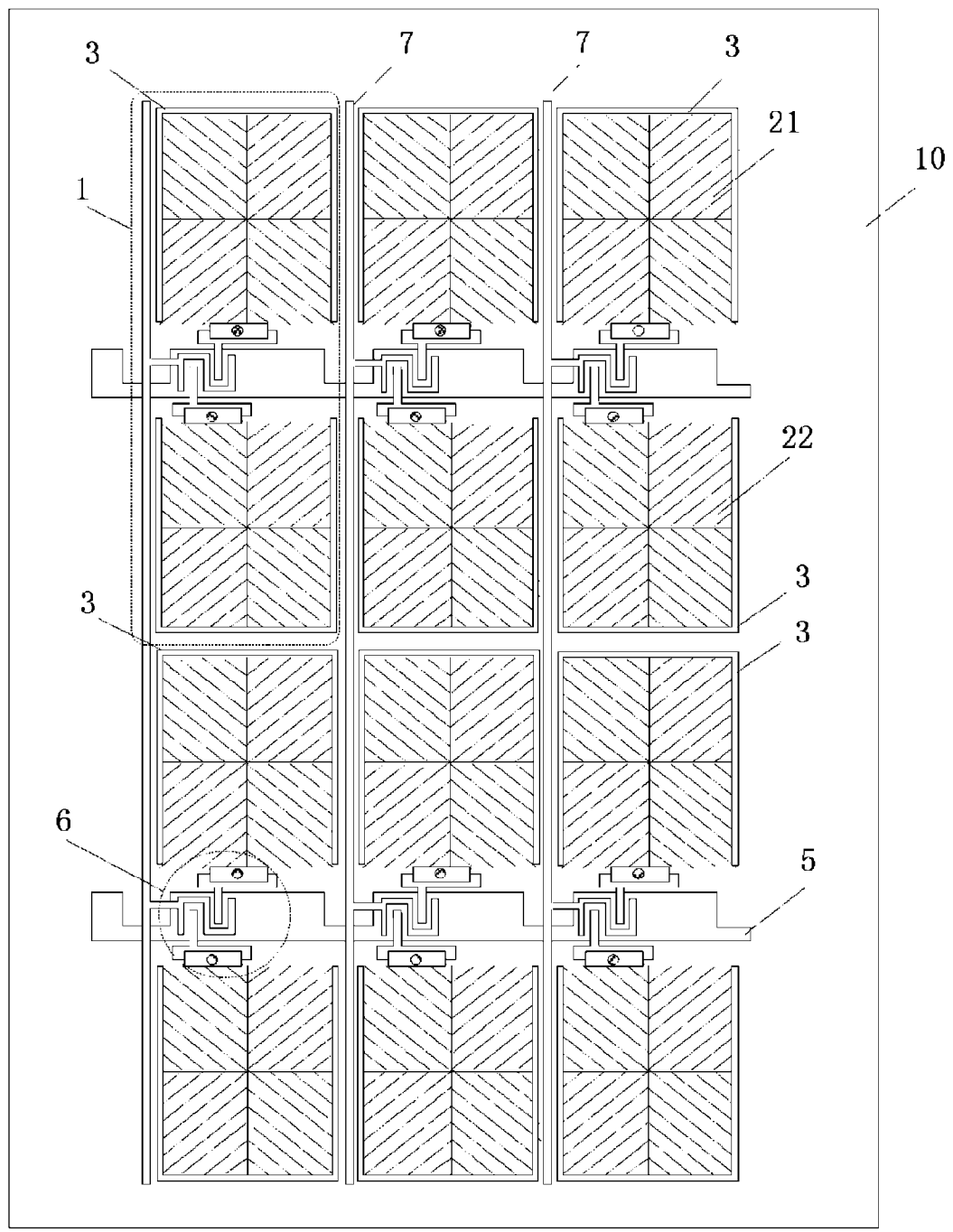
FIG. 6 is a structural view for a third specific array substrate on basis of FIG. 3.

Reference is made to FIG. 4. A first specific array substrate is provided on basis of FIG. 3, which comprises a base plate 10. An array of sub-pixel units is formed on the base plate 10. Each sub-pixel unit 1 comprises a , and the first pixel electrode 21 and the second pixel electrode 22 which are arranged in the column direction and have a comb structure. A gate line 5 is arranged between the first pixel electrode 21 and the second pixel electrode 22 of sub-pixel units belonging to the same column, and a data line 7 is arranged between two neighboring columns of sub-pixel units 1. The shielding electrode 3 is arranged at the upper edge of the first pixel electrode 21, and the shielding electrode 3 is arranged at the lower edge of the second pixel electrode 22. Of course, the shielding electrode 3 can also be arranged at multiple edges of the first pixel electrode 21 and the second pixel electrode 22. For example, as shown in FIG. 5, a second specific array substrate is provided on basis of FIG. 3. This array substrate differs from that of FIG. 4 in that, the shielding electrode 3 is arranged at the upper edge and one lateral edge of the first pixel electrode 21, and the shielding electrode 3 is arranged at the lower edge and one lateral edge of the second pixel electrode 22. Besides, for example as shown in FIG. 6, a third specific array substrate is provided on basis of FIG. 3. This array substrate differs from that of FIG. 4 in that, the shielding electrode 3 is arranged at the upper edge and two lateral edges the first pixel electrode 21, and the shielding electrode 3 is arranged at the lower edge and two lateral edges of the second pixel electrode 22. In the array substrate of FIG. 5 and FIG. 6, the shielding electrode 3 is arranged at at least two edges of the first pixel electrode 21 and the second pixel electrode 22, so that interference on the surrounding data lines 7, gate lines 5, and neighboring sub-pixel units 1 due to tip discharge from the comb-shaped first pixel electrode 21 and second pixel electrode 22 of the sub-pixel units 1 can be better eliminated.

Preferably, the shielding electrode 3 and the pixel electrode 2 are arranged in the same layer. In the present embodiment, the process can be saved by arranging the shielding electrode 3 and the pixel electrode 2 in the same layer.

Preferably, the shielding electrode 3 is made from ITO or IZO.

Embodiments of the present invention have the following beneficial effects. The shielding electrode is arranged at at least one edge of the pixel electrode, so that interference on surrounding data lines, gate lines, and neighboring sub-pixel units due to tip discharge of the pixel electrode is eliminated, and display effect of the display panel is improved.

An embodiment of the present invention provides a display panel comprising the array substrate provided in the above embodiments.

Embodiments of the present invention have the following beneficial effects. The shielding electrode is arranged at at least one edge of the pixel electrode, so that interference on surrounding data lines, gate lines, and neighboring sub-pixel units due to tip discharge of the pixel electrode is eliminated, and display effect of the display panel is improved.

An embodiment of the present invention provides a display device comprising the array substrate provided in the above embodiments.

Embodiments of the present invention have the following beneficial effects. The shielding electrode is arranged at at least one edge of the pixel electrode, so that interference on surrounding data lines, gate lines, and neighboring sub-pixel units due to tip discharge of the pixel electrode is eliminated, and display effect of the display panel is improved.

Although the present invention has been described above with reference to specific embodiments, it should be understood that the limitations of the described embodiments are merely for illustrative purpose and by no means limiting. Instead, the scope of the invention is defined by the appended claims rather than by the description, and all variations that fall within the range of the claims are intended to be embraced therein. Thus, other embodiments than the specific ones described above are equally possible within the scope of these appended claims.

The invention claimed is:
1. An array substrate, comprising a base plate, the base plate is provided with a plurality of sub-pixel units, each of the sub-pixel units comprises a pixel electrode of a comb structure, wherein the base plate is further provided with a shielding electrode which is electrically conductively connected with the pixel electrode, the pixel electrode has a comb structure at an edge or has a comb structure as a whole, and the shielding electrode and the pixel electrode are arranged in a same layer.

2. The array substrate of claim 1, wherein the shielding electrode is electrically conductively connected with a tip of the comb structure of the pixel electrode.

3. The array substrate of claim 1, wherein every two rows of sub-pixel units form a sub-pixel unit group, two gate lines are arranged between two rows of sub-pixel units of each of the sub-pixel unit groups; and
    the shielding electrode is at least arranged at an upper edge of the pixel electrode in an upper row of sub-pixel units of the sub-pixel unit group, and the shielding electrode is at least arranged at a lower edge of the pixel electrode in a lower row of sub-pixel units of the sub-pixel unit group.

4. The array substrate of claim 1, wherein the pixel electrode comprises a first pixel electrode and a second pixel electrode which are arranged from top to bottom in a column direction, and a gate line is arranged between the first pixel electrode and the second pixel electrode of sub-pixel units belonging to a same column; and
    the shielding electrode is arranged at an upper edge of the first pixel electrode, and the shielding electrode is arranged at a lower edge of the second pixel electrode.

5. The array substrate of claim 1, wherein the pixel electrode comprises a first pixel electrode and a second pixel electrode which are arranged from top to bottom in a column direction, and a gate line is arranged between the first pixel electrode and the second pixel electrode of sub-pixel units belonging to a same column; and
    the shielding electrode is arranged at at least one edge of the first pixel electrode, and the shielding electrode is arranged at at least one edge of the second pixel electrode.

6. The array substrate of claim 1, wherein the pixel electrode comprises a first pixel electrode and a second pixel electrode which are arranged from top to bottom in a column direction, and a gate line is arranged between the first pixel electrode and the second pixel electrode of sub-pixel units belonging to a same column; and
    the shielding electrode is arranged at all edges of the first pixel electrode and the second pixel electrode.

7. The array substrate of claim 1, wherein the shielding electrode is made from ITO or IZO.

8. A display panel comprising an array substrate, the array substrate comprises a base plate, the base plate is provided with a plurality of sub-pixel units, each of the sub-pixel units comprises a pixel electrode of a comb structure, wherein the base plate is further provided with a shielding electrode which is electrically conductively connected with the pixel electrode, the pixel electrode has a comb structure at an edge or has a comb structure as a whole, and the shielding electrode and the pixel electrode are arranged in a same layer.

9. A display device, comprising the display panel of claim 8.

10. The display panel of claim 8, wherein the shielding electrode is electrically conductively connected with a tip of the comb structure of the pixel electrode.

11. The display panel of claim 8, wherein every two rows of sub-pixel units form a sub-pixel unit group, two gate lines are arranged between two rows of sub-pixel units of each of the sub-pixel unit groups; and
    the shielding electrode is at least arranged at an upper edge of the pixel electrode in an upper row of sub-pixel units of the sub-pixel unit group, and the shielding electrode is at least arranged at a lower edge of the pixel electrode in a lower row of sub-pixel units of the sub-pixel unit group.

12. The display panel of claim 8, wherein the pixel electrode comprises a first pixel electrode and a second pixel electrode which are arranged from top to bottom in a column direction, and a gate line is arranged between the first pixel electrode and the second pixel electrode of sub-pixel units belonging to a same column; and the shielding electrode is arranged at all edges of the first pixel electrode and the second pixel electrode.

\* \* \* \* \*